United States Patent
Zhang et al.

(10) Patent No.: US 10,732,130 B2
(45) Date of Patent: Aug. 4, 2020

(54) EMBEDDED PARTICLE DEPTH BINNING BASED ON MULTIPLE SCATTERING SIGNALS

(71) Applicant: KLA-Tencor Corporation, Milpitas, CA (US)

(72) Inventors: Haiping Zhang, Fremont, CA (US); Gang Yu, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/165,742

(22) Filed: Oct. 19, 2018

(65) Prior Publication Data

US 2019/0383754 A1    Dec. 19, 2019

Related U.S. Application Data

(60) Provisional application No. 62/687,123, filed on Jun. 19, 2018.

(51) Int. Cl.
| | |
|---|---|
| *G01N 21/956* | (2006.01) |
| *H01L 21/66* | (2006.01) |
| *G01N 21/95* | (2006.01) |
| *G01N 21/88* | (2006.01) |
| *G01N 21/47* | (2006.01) |

(52) U.S. Cl.
CPC ....... *G01N 21/95607* (2013.01); *G01N 21/47* (2013.01); *G01N 21/8806* (2013.01); *G01N 21/9501* (2013.01); *H01L 22/12* (2013.01); *G01N 2021/4711* (2013.01); *G01N 2021/4792* (2013.01); *G01N 2021/95615* (2013.01)

(58) Field of Classification Search
CPC ............. G01N 21/95607; G01N 21/47; G01N 21/8806; G01N 21/9501; G01N 2021/4711; G01N 2021/4792; G01N 2021/95615; H01L 22/12
USPC .......................................... 356/237.2–237.6
See application file for complete search history.

(56) References Cited

U.S. PATENT DOCUMENTS

| | | |
|---|---|---|
| 6,181,420 B1 | 1/2001 | Badami et al. |
| 6,201,601 B1 | 3/2001 | Vaez-Iravani et al. |
| 6,947,588 B2 | 9/2005 | Sim |

(Continued)

FOREIGN PATENT DOCUMENTS

EP     3333631 A1    6/2018

*Primary Examiner* — Isiaka O Akanbi
(74) *Attorney, Agent, or Firm* — Suiter Swantz pc llo

(57) ABSTRACT

An inspection system may include an illumination source to generate an illumination beam, illumination optics to direct the illumination beam to a sample. The system may further include a first collection channel to collect light from the sample within a first range of solid angles and at a first selected polarization. The system may further include a second collection channel to collect light from the sample within a second angular range, the second range of solid angles and at a second selected polarization. The system may further include a controller to receive two or more scattering signals. The scattering signals may include signals from the first and second collection channels having selected polarizations. The controller may further determine depths of defects in the sample based on comparing the two or more scattering signals to training data including data from a training sample having known defects at known depths.

44 Claims, 10 Drawing Sheets

(56) References Cited

U.S. PATENT DOCUMENTS

| | | |
|---|---|---|
| 7,554,656 B2 | 6/2009 | Shortt et al. |
| 9,535,010 B2 | 1/2017 | Gosain et al. |
| 9,563,943 B2 | 2/2017 | Kurada et al. |
| 2005/0018182 A1* | 1/2005 | Hyun .................. G01N 21/9501 356/237.4 |
| 2008/0144023 A1* | 6/2008 | Shibata .................. G01N 21/21 356/237.2 |
| 2010/0208249 A1 | 8/2010 | Shibata et al. |
| 2011/0246142 A1 | 10/2011 | Li et al. |
| 2012/0316855 A1 | 12/2012 | Park et al. |
| 2014/0307052 A1 | 10/2014 | Ahn et al. |
| 2016/0018340 A1* | 1/2016 | Otani .................. G01N 21/8851 356/237.2 |
| 2018/0103247 A1 | 4/2018 | Kolchin et al. |

* cited by examiner

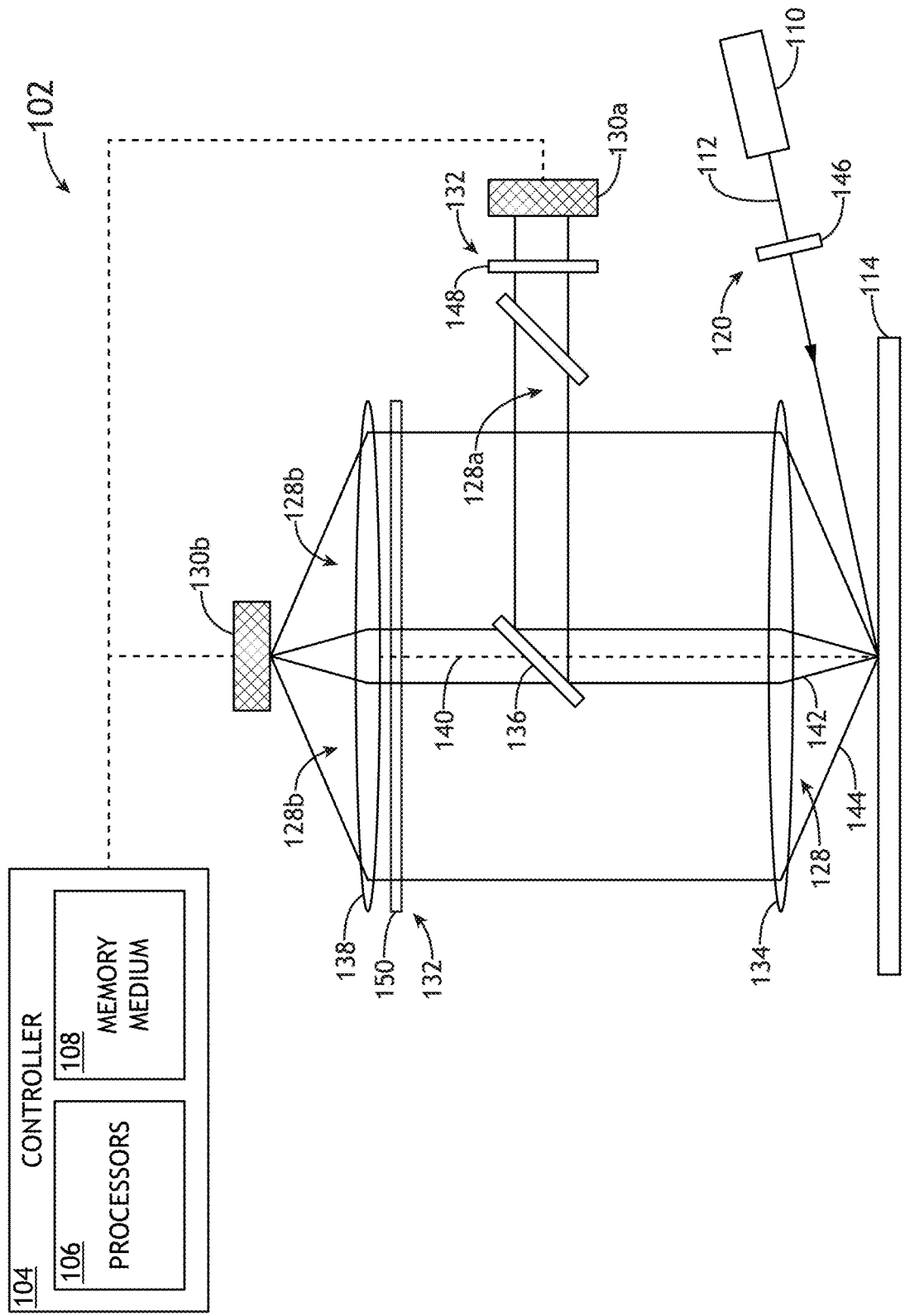

EMBEDDED PARTICLE DEPTH BINNING BASED ON MULTIPLE SCATTERING SIGNALS

CROSS-REFERENCE TO RELATED APPLICATION

The present application claims the benefit under 35 U.S.C. § 119(e) of U.S. Provisional Application Ser. No. 62/687,123, filed Jun. 19, 2018, entitled EMBEDDED PARTICLE DEPTH BINNING USING CHANNEL BASED METHOD BY MORE THAN TWO SCANS, naming Haiping Zhang and Alex Yu as inventors, which is incorporated herein by reference in the entirety.

TECHNICAL FIELD

The present disclosure relates generally to defect inspection and, more particularly, to depth determination of defects.

BACKGROUND

Semiconductor devices such as, but not limited to, 3D memory stacks include multilayer film stacks that may include tens or hundreds of film layers. Such multilayer film stacks may be susceptible to embedded defects on any of the film layers and it is typically desirable to monitor both defect frequency and the depths at which the defects occur. For example, defect depth data may pinpoint particular fabrication steps susceptible to defects. However, it is typically undesirable and/or impractical to inspect multilayer samples after the deposition of each layer. Accordingly, multilayer samples may typically be inspected for defects after the deposition of multiple layers or even the entire film stack.

As the number of film stacks increase, determining depth information of embedded defects presents increasing challenges. For example, depths of embedded defects in multilayer stacks may typically be accurately determined using an invasive approach such as focused ion-beam (FIB) milling. However, invasive measurement techniques may be time-consuming and may be applied only to representative test samples rather than production samples. It is therefore desirable to create systems and methods that cure the deficiencies above.

SUMMARY

An inspection system is disclosed in accordance with one or more illustrative embodiments of the present disclosure. In one illustrative embodiment, the system includes an illumination source configured to generate an illumination beam. In another illustrative embodiment, the system includes one or more illumination optics to direct the illumination beam to a sample. In another illustrative embodiment, the system includes a first collection channel including at least a first detector to collect light from the sample in response to the illumination beam within a first range of solid angles. In another illustrative embodiment, the first collection channel further includes a first polarizer to control a polarization of the light from the sample incident on the first detector. In another illustrative embodiment, the system includes a second collection channel including at least a second detector to collect light from the sample in response to the illumination from the illumination source within a second range of solid angles. In another illustrative embodiment, the second collection channel further includes a second polarizer to control a polarization of the light from the sample incident on the second detector. In another illustrative embodiment, the system includes a controller. In another illustrative embodiment, the controller receives two or more scattering signals, where the two or more scattering signals include one or more scattering signals from the first collection channel based on one or more orientations of the first polarizer and one or more scattering signals from the second collection channel based on one or more orientations of the second polarizer. In another illustrative embodiment, the controller determines depths of one or more defects in the sample based on comparing the two or more scattering signals to training data, where the training data includes scattering signals from a training sample having known defects at known depths.

An inspection system is disclosed in accordance with one or more illustrative embodiments of the present disclosure. In one illustrative embodiment, the system includes a controller. In another illustrative embodiment, the controller receives one or more scattering signals from a first collection channel. In another illustrative embodiment, the first collection channel includes a first detector to collect light from a sample within a first range of solid angles in response to an illumination beam and further includes a first adjustable polarizer to control a polarization of the light from the sample incident on the first detector, where the one or more scattering signals from the first collection channel are based on one or more polarization states of the first adjustable polarizer. In another illustrative embodiment, the controller receives one or more scattering signals from a second collection channel. In another illustrative embodiment, the second collection channel includes a second detector to collect light from the sample in response to the illumination beam within a second range of solid angles and further includes a second adjustable polarizer to control a polarization of the light from the sample incident on the second detector, where the one or more scattering signals from the second collection channel are based on one or more polarization states of the second adjustable polarizer. In another illustrative embodiment, the controller determines depths of one or more defects in the sample based on comparing the one or more scattering signals from the first and second collection channels to training data, where the training data includes scattering signals from a training sample having known defects at known depths.

An inspection method is disclosed in accordance with one or more illustrative embodiments of the present disclosure. In one illustrative embodiment, the method includes receiving one or more scattering signals from a first collection channel. In another illustrative embodiment, the first collection channel includes a first detector to collect light from a sample within a first range of solid angles in response to an illumination beam and further includes a first adjustable polarizer to control a polarization of the light from the sample incident on the first detector, where the one or more scattering signals from the first collection channel are based on one or more polarization states of the first adjustable polarizer. In another illustrative embodiment, the method includes receiving one or more scattering signals from a second collection channel. In another illustrative embodiment, the second collection channel includes a second detector to collect light from the sample in response to the illumination beam within a second range of solid angles and further includes a second adjustable polarizer to control a polarization of the light from the sample incident on the second detector, where the one or more scattering signals from the second collection channel are based on one or more polarization states of the second adjustable polarizer. In another illustrative embodiment, the method includes determining depths of one or more defects in the sample based on comparing the one or more scattering signals from the first and second collection channels to training data, where the training data includes scattering signals from a training sample having known defects at known depths.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1C is a conceptual view illustrating an inspection tool including two collection channels for generating scattering signals associated with light from the sample within two different ranges of solid angles in response to illumination at an oblique incidence angle, in accordance with one or more embodiments of the present disclosure.

DETAILED DESCRIPTION

Figure 1A:
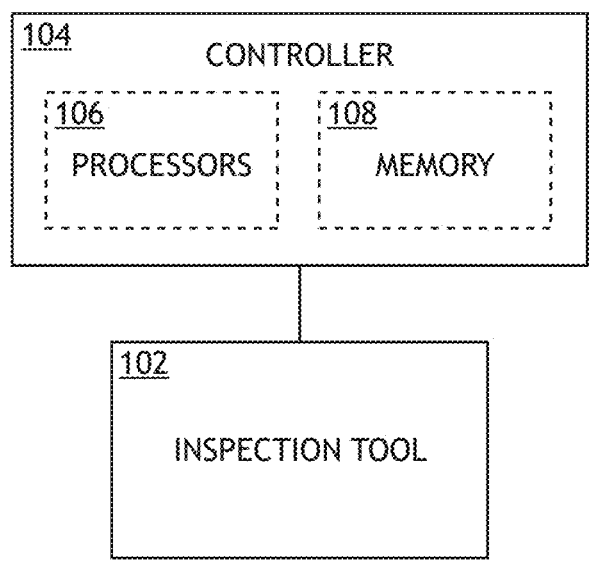
FIG. 1A is a conceptual view illustrating an inspection system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to non-invasive depth determination of embedded defects in a sample based on one or more optical scans. It is recognized herein that light scattering signatures of defects typically depend on a wide range of structural factors and measurement conditions. For example, defect scattering signals may depend on the structure and composition of both the defect and the sample. Multiple types of defects may be present in a fabricated sample including, but not limited to, embedded particles, cracks, or voids. The scattering signals may thus depend on the size, structure, and composition of these defects relative to the surrounding material. By way of another example, light scattering signatures may depend on measurement conditions such as, but not limited to, the spectrum of incident light, the polarization of incident light, the polarization of collected light, or solid angles at which light is collected.

Accordingly, multiple optical scattering signals generated with different measurement conditions may be utilized to extract defect depth information from scattering signals. Additional embodiments of the present disclosure are directed to a multichannel inspection system providing two or more scattering signals based on different measurement configurations. In this regard, depths of embedded defects may be determined based on comparisons of the two or more scattering signals. In some embodiments, the multichannel inspection system may direct an illumination beam to a sample and collect light from the sample with multiple measurement configurations. For example, the multichannel inspection system may include two or more channels configured to collect light from the sample at two different ranges of solid angles during a single scan of the sample. Further, each channel may include a polarizer to control polarization of collected light. Accordingly, each channel may provide various scattering signals based on differing combinations of the polarizations of the collected light and the incident illumination beam.

Additional embodiments of the present disclosure are directed to generating scattering signals at a fixed focus height. For example, multiple scattering signals may be generated with the sample at a fixed focal position relative to an objective lens for illuminating the sample and/or collecting light from the sample. In this regard, the multiple scattering signals may be efficiently and accurately generated.

Additional embodiments of the present disclosure are directed to generating training data to guide the depth determination of embedded defects. For example, training data may be based on an analysis of a calibration sample including known defects at known depths. The training data may include any combination of experimental data (e.g., from training samples fabricated with known defects at known locations) and simulation data (e.g., from simulations of scattering signals by samples having known defects at known locations).

Additional embodiments of the present disclosure are directed to identifying relationships between defect depth and scattering signals based on the training data. For example, the training data may be used to determine rules for sorting defects into depth bins based on a sequence of scattering signal comparisons. By way of another example, the training data may be used as training data for a machine-learning algorithm.

Additional embodiments of the present disclosure are directed to determining depths of defects of samples of interest including unknown defects (e.g., production-line samples) based on two or more scattering signals at different measurement configurations and the identified relationships between defect depth and scattering signals. In some cases, depth values of measured defects may be directly determined. In some cases, defects are sorted into selected depth ranges (e.g., bins).

Various techniques may be utilized to determine defect depths based on the two or more scattering signals and the identified relationships between defect depth and scattering signals. In some embodiments, a set of rules is generated based on the training data and then used to determine defect depth. For example, it may be the case that a comparison of a first set of scattering signals (associated with selected measurement configurations) may distinguish surface-level defects from sub-surface defects, whereas a second set of scattering signals may distinguish defects within a first depth range (e.g., a first bin) from remaining depth ranges (e.g., bins), and so on. In this regard, defects within each depth range of interest may be distinguished based on a selected series of comparisons between different scattering signals. By way of another example, defect depth may be determined through a multidimensional pattern recognition technique. For instance, a machine-learning algorithm may be trained to determine the relationships between defect depth and scattering signal based on the training data during a training phase. During an inspection phase, defect depths on samples of interest may be provided by the machine-learning algorithm based on the scattering signals from the samples of interest.

Referring now to FIGS. 1 through 6, an inspection system 100 in accordance with one or more embodiments of the present disclosure is described in greater detail.

FIG. 1A is a conceptual view illustrating an inspection system 100, in accordance with one or more embodiments of the present disclosure. In one embodiment, the inspection system 100 includes an inspection tool 102 configured to characterize one or more properties of a sample. In another embodiment, the inspection system 100 includes a controller 104 communicatively coupled to the inspection tool 102. In another embodiment, the controller 104 includes one or more processors 106 configured to execute program instructions maintained on a memory medium 108, or memory. The one or more processors 106 of a controller 104 may include any processing element known in the art. In this sense, the one or more processors 106 may include any microprocessor-type device configured to execute algorithms and/or instructions. Further, the memory medium 108 may include any storage medium known in the art suitable for storing program instructions executable by the associated one or more processors 106. For example, the memory medium 108 may include a non-transitory memory medium. As an additional example, the memory medium 108 may include, but is not limited to, a read-only memory (ROM), a random-access memory (RAM), a magnetic or optical memory device (e.g., disk), a magnetic tape, a solid-state drive and the like. It is further noted that memory medium 108 may be housed in a common controller housing with the one or more processors 106.

The one or more processors 106 of the controller 104 may execute any of the various process steps described throughout the present disclosure. For example, the one or more processors 106 of controller 104 may receive scattering signals from the inspection tool 102 associated with a sample and determine depth information of one or more defects based on the scattering signals.

Figure 1B:
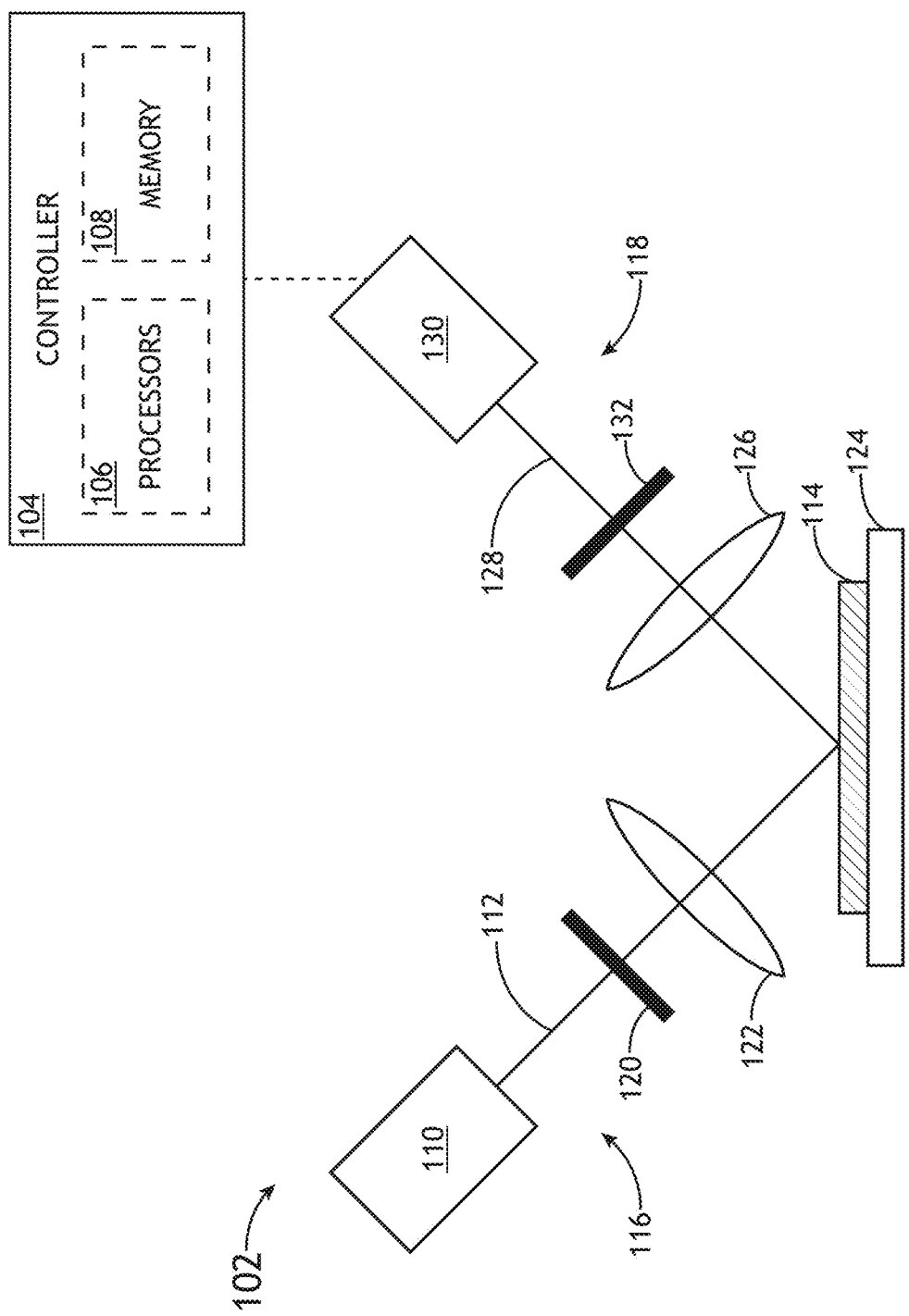
FIG. 1B is a conceptual view illustrating an inspection tool, in accordance with one or more embodiments of the present disclosure.

FIG. 1B is a conceptual view illustrating the inspection tool 102, in accordance with one or more embodiments of the present disclosure. In one embodiment, the inspection tool 102 includes an illumination source 110 to generate an illumination beam 112. The illumination beam 112 may include one or more selected wavelengths of light including, but not limited to, ultraviolet (UV) radiation, visible radiation, or infrared (IR) radiation. For example, the illumination source 110 may provide, but is not required to provide, an illumination beam 112 having wavelengths of approximately 266 nm.

The illumination source 110 may include, but is not limited to, one or more narrowband laser sources, one or more broadband laser sources, one or more supercontinuum laser sources, one or more white light laser sources, and the like. In another embodiment, the illumination source 110 includes a laser-driven light source (LDLS) such as, but not limited to, a laser-sustained plasma (LSP) source. For example, the illumination source 110 may include, but is not limited to, an LSP lamp, an LSP bulb, or an LSP chamber suitable for containing one or more elements that, when excited by a laser source into a plasma state, may emit broadband illumination. In this regard, the illumination source 110 may provide an illumination beam 112 having high coherence (e.g., high spatial coherence and/or temporal coherence). In another embodiment, the illumination source 110 includes a lamp source. By way of another example, the illumination source 110 may include, but is not limited to, an arc lamp, a discharge lamp, an electrode-less lamp, and the like. In this regard, the illumination source 110 may provide an illumination beam 112 having low coherence (e.g., low spatial coherence and/or temporal coherence).

In another embodiment, the illumination source 110 provides a tunable illumination beam 112. For example, the illumination source 110 may include a tunable source of illumination (e.g., one or more tunable lasers, and the like). By way of another example, the illumination source 110 may include a broadband illumination source coupled to a tunable filter.

The illumination source 110 may further provide an illumination beam 112 having any temporal profile. For example, the illumination beam 112 may have a continuous temporal profile, a modulated temporal profile, a pulsed temporal profile, and the like.

In another embodiment, the illumination source 110 directs the illumination beam 112 to a sample 114 via an illumination pathway 116 and collects radiation emanating from the sample 114 via a collection pathway 118. The illumination pathway 116 may include one or more illumination beam-conditioning components 120 suitable for modifying and/or conditioning the illumination beam 112. For example, the one or more illumination beam-conditioning components 120 may include, but are not limited to, one or more polarizers, one or more filters, one or more beam splitters, one or more diffusers, one or more homogenizers, one or more apodizers, one or more beam shapers, or one or more lenses.

In another embodiment, the illumination pathway 116 may utilize an illumination focusing element 122 to focus the illumination beam 112 onto the sample 114 disposed on a sample stage 124. In another embodiment, the collection pathway 118 may include a collection focusing element 126 to collect light from the sample 114. For example, a detector 130 may receive collected light 128 scattered and/or reflected from the sample 114. By way of another example, a detector 130 may receive collected light 128 generated by the sample 114 (e.g., luminescence associated with absorption of the illumination beam 112, and the like).

In another embodiment, the inspection tool 102 includes one or more detectors 130 configured to capture radiation emanating from the sample 114 through the collection pathway 118. The detectors 130 may include any type of optical detector known in the art suitable for measuring illumination received from the sample 114. For example, a detector 130 may include, but is not limited to, a charge-coupled device (CCD) detector, a complementary metal-oxide-semiconductor (CMOS) detector, a time-delayed integration (TDI) detector, a photomultiplier tube (PMT), an avalanche photodiode (APD), and the like. In another embodiment, a detector 130 may include a spectroscopic detector suitable for identifying wavelengths of the collected light 128.

The collection pathway 118 may further include any number of collection beam-conditioning elements 132 to direct and/or modify the collected light 128 including, but not limited to, one or more lenses, one or more filters, one or more polarizers, or one or more phase plates. In this regard, the inspection tool 102 may control the polarization of light incident on a detector 130. Further, the inspection tool 102 may operate as any type of inspection and/or metrology tool such as, but not limited to, a spectroscopic ellipsometer with one or more angles of illumination, a spectroscopic ellipsometer for measuring Mueller matrix elements (e.g., using rotating compensators), a single-wavelength ellipsometer, an angle-resolved ellipsometer (e.g., a beam-profile ellipsometer), a spectroscopic reflectometer, a single-wavelength reflectometer, an angle-resolved reflectometer (e.g., a beam-profile reflectometer), or a scatterometer.

In another embodiment, though not shown, the inspection tool 102 includes a chamber suitable for regulating the composition and/or the pressure of the atmosphere surrounding the sample 114. For example, the inspection tool 102 may include one or more gas tanks, one or more valves, one or more hoses, one or more pumps, one or more pressure regulators, and the like to control the composition and/or pressure of the atmosphere of the surrounding the sample 114. In another embodiment, the inspection tool 102 is configured to provide an inert gas or a gas substantially transparent to wavelengths provided by the illumination source 110 as an atmosphere surrounding the sample 114.

It is noted herein that the inspection tool 102 depicted in FIG. 1B may facilitate multi-angle illumination of the sample 114 and/or collection of multiple scattering signals on one or more detectors 130 to generate multiple scattering signals sequentially or simultaneously.

The inspection tool 102 may further be configured to provide any type of imaging known in the art such as, but not limited to, brightfield imaging, dark-field imaging, phase-contrast imaging, or the like. For example, the inspection tool 102 may direct the illumination beam 112 to the sample 114 at any incidence angle. Further, the inspection tool 102 may include any combination of apertures or phase plates in the illumination pathway 116 and/or the collection pathway 118.

Figure 1D:
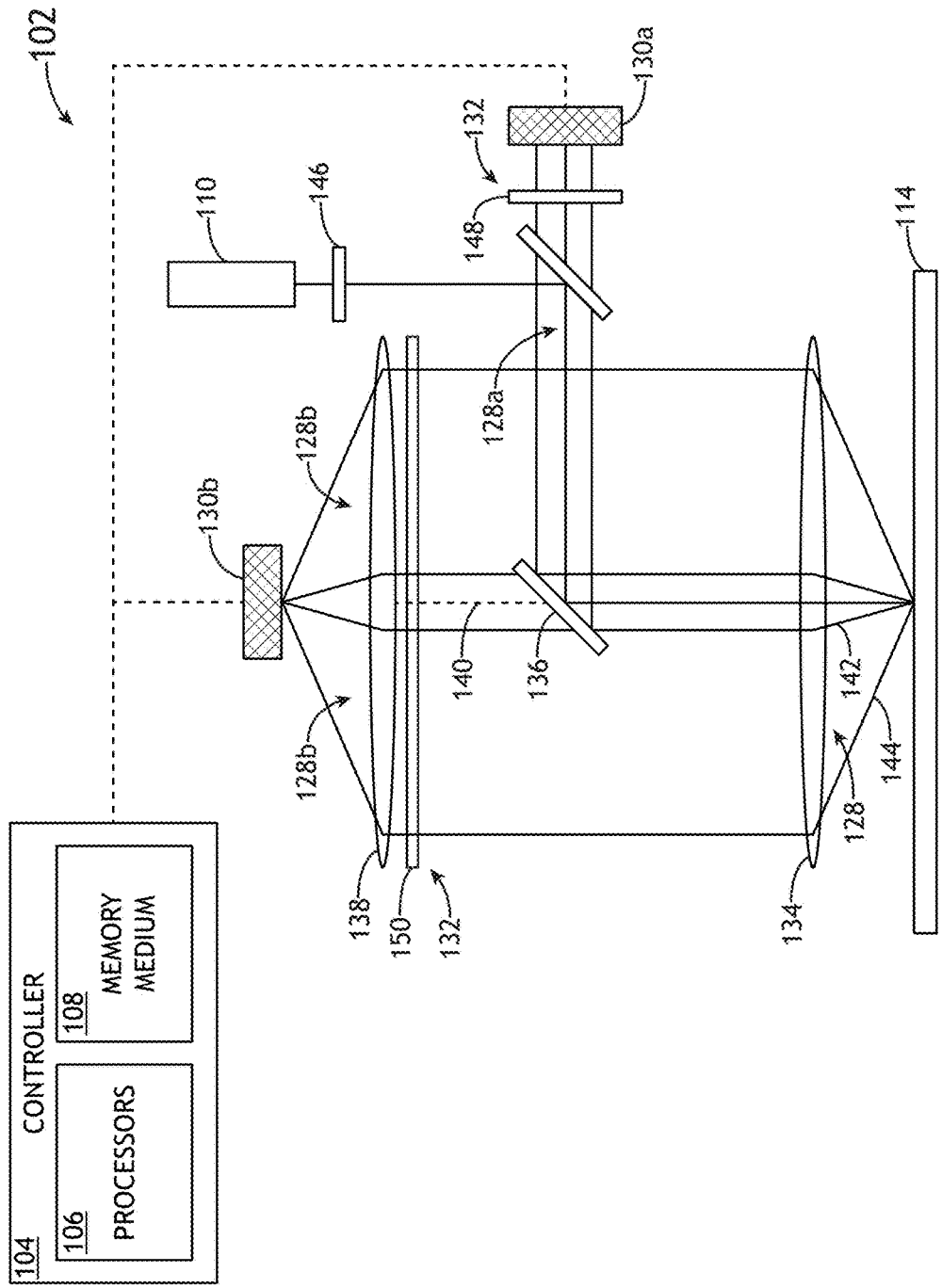
FIG. 1D is a conceptual view illustrating an inspection tool including two collection channels for generating scattering signals associated with light from the sample within two different ranges of solid angles in response to illumination at a normal incidence angle, in accordance with one or more embodiments of the present disclosure.

Referring now to FIGS. 1C and 1D, configurations of an inspection tool 102 based on oblique and normal incidence are described in greater detail. The configurations of the inspection tool 102 in FIGS. 1C and 1D include two collection channels for generating scattering signals including different ranges of solid angles. It is to be understood, however, that the configurations of the inspection tool 102 in FIGS. 1C and 1D are provided solely for illustrative purposes and should not be interpreted as limiting. Rather, the inspection tool 102 may provide any number of collection channels based on any number of solid angle ranges.

FIG. 1C is a conceptual view illustrating an inspection tool 102 including two collection channels for generating scattering signals associated with light from the sample 114 within two different ranges of solid angles in response to illumination at an oblique incidence angle, in accordance with one or more embodiments of the present disclosure. In this regard, the inspection tool 102 illustrated in FIG. 1C may provide, but is not limited to, dark-field imaging of the sample 114. In one embodiment, the inspection tool 102 includes an objective lens 134 to collect radiation emanating from the sample 114. In another embodiment, the inspection tool 102 includes a mirror 136 configured to direct a first portion 128a of the collected light 128 to a first detector 130a and allow a second portion 128b of the collected light 128 to propagate to a second detector 130b. Further, a focusing lens 138 may focus the second portion 128b of the collected light 128 to the second detector 130b. In this regard, the first portion 128a may include a first range of solid angles of the collected light 128 and the second portion 128b may include a second range of solid angles of the collected light 128.

Further, the mirror 136 may be, but is not required to be, shaped to provide splitting of the collected light 128 into azimuthally-symmetric channels. For example, the first portion 128a of the collected light 128 may include an azimuthally-symmetric cone of solid angles (e.g., ranging from an optical axis 140 of the objective lens 134 to a first solid angle 142) and the second portion 128b of the collected light 128 may include an azimuthally-symmetric annular ring of solid angles (e.g., ranging the first solid angle 142 to a second solid angle 144).

FIG. 1D is a conceptual view illustrating an inspection tool 102 including two collection channels for generating scattering signals associated with light from the sample 114 within two different ranges of solid angles in response to illumination at a normal incidence angle, in accordance with one or more embodiments of the present disclosure. In one embodiment, as illustrated in FIG. 1D, the illumination source 110 is configured to direct the illumination beam 112 to the sample 114 at a normal incidence angle. Accordingly, the first portion 128a of the collected light 128 may be, but is not required to be, associated with a bright-field scattering signal and the second portion 128b of the collected light 128 may be, but is not required to be, associated with a dark-field scattering signal.

Referring generally to FIGS. 1C and 1D, the inspection tool 102 may be configured to provide various scattering signals associated with different measurement configurations. For example, the illumination beam-conditioning components 120 may include an illumination polarizer 146 to adjust a polarization of the illumination beam 112 to any selected polarization state. By way of another example, the collection beam-conditioning elements 132 may include a first collection polarizer 148 to adjust a polarization of the first portion 128a of the collected light 128 to any selected polarization state and/or a second collection polarizer 150 to adjust a polarization of the second portion 128b of the collected light 128 to any selected polarization state.

Various scattering signals may be generated simultaneously or sequentially. For example, scattering signals associated with the first portion 128a and the second portion 128b of the collected light 128 configured with selected polarization states may be simultaneously collected. Further, additional scattering signals may be sequentially generated after modifying the configuration of the inspection tool 102 (e.g., a wavelength of the illumination beam 112, a polarization of the illumination beam 112, and/or polarizations of any portion of the collected light 128).

It is to be understood, however, that FIGS. 1B through 1D and the associated description are provided solely for illustration and should not be interpreted as limiting. The inspection tool 102 may be configurable to provide any configuration suitable for generating multiple scattering signals. For example, the inspection tool 102 may include any number of splitting mirrors (e.g., mirror 136), apertures, masks, or the like suitable for generating scattering signals including collected light 128 within any number of solid angle ranges. For instance, the inspection tool may provide three or more channels to generate scattering signals associated with three or more solid angle ranges. Further, the inspection tool 102 may be configured to provide any combination of brightfield or dark-field scattering signals based on any number of illumination sources.

Figure 2:
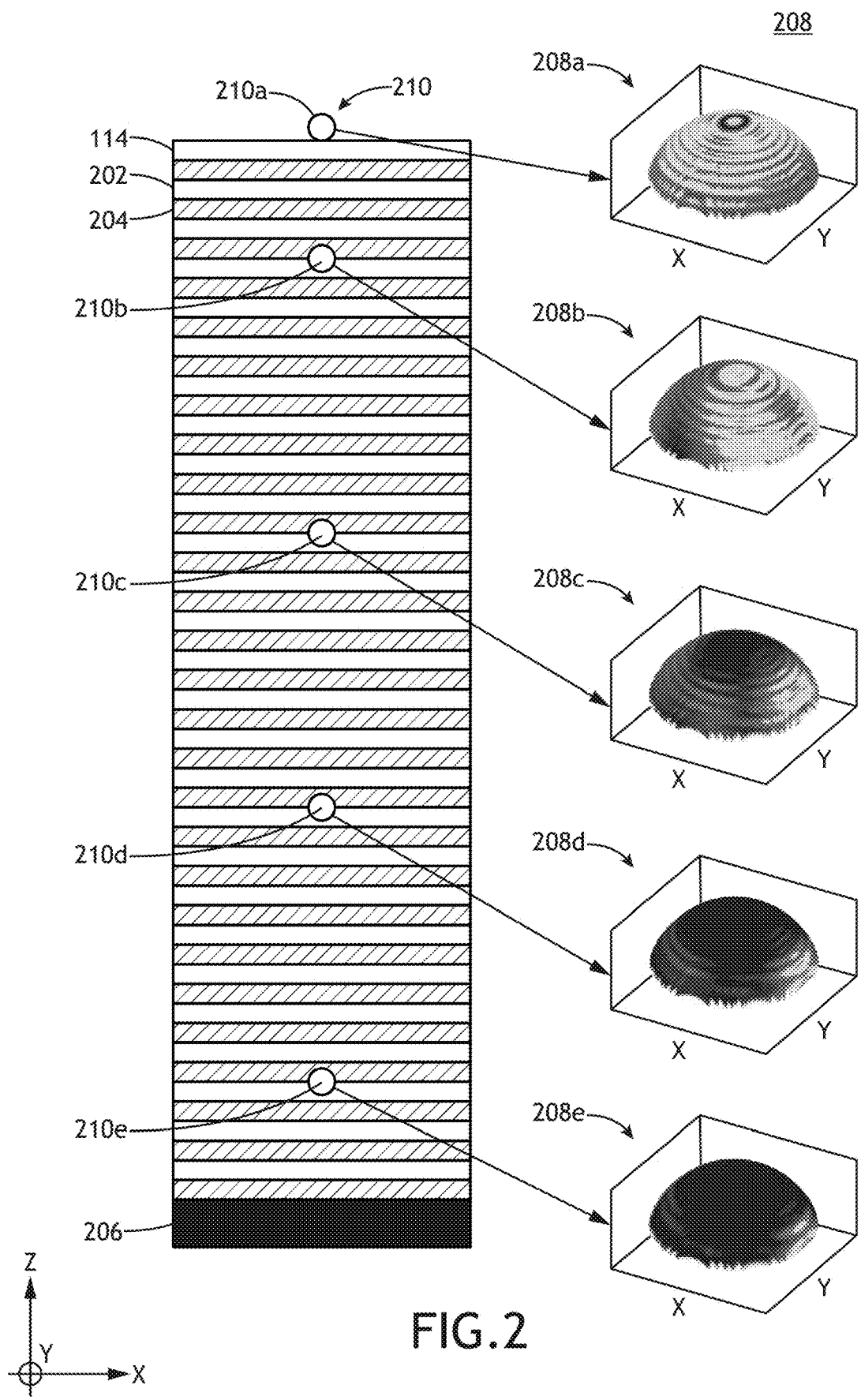
FIG. 2 is a side view of a multilayer sample including alternating layer pairs of an oxide material and a nitride material deposited on a substrate, along with simulated scattering signals associated with embedded defects at different depths, in accordance with one or more embodiments of the present disclosure.

Referring now to FIG. 2, relationships between defect depth and scattering signal are generally described. The scattering signal of embedded defects may generally depend on a variety of factors such as, but not limited to, the defect depth, the composition of the defect, the composition of the sample 114, the polarization of incident light, and the polarization of collected light. Accordingly, depth information associated with embedded defects may be extracted from measurements of scattering signals. Further, measuring scattering signals using different measurement configurations may increase the sensitivity and robustness of the depth determination by providing additional depth-dependent data. In addition, prior knowledge of the compositions of the sample 114 as well as any anticipated defects may be used to further determine defect depth based on scattering signals. For example, scattering behavior may be modeled or experimentally analyzed for different defect compositions at different depths in a given sample to provide training data. The training data may then be used to guide the depth determination for defects in samples of interest.

FIG. 2 is a side view of a multilayer sample 114 including alternating layer pairs of an oxide material 202 and a nitride material 204 deposited on a substrate 206 (e.g., silicon, or the like), along with simulated scattering signals 208a-e associated with embedded defects 210 (here, silica spheres) at different depths, in accordance with one or more embodiments of the present disclosure. For example, under a given set of optical measurement conditions and illumination at an oblique angle along the X-direction, a scattering site of a defect 210a on a surface of the sample 114 may provide a scattering signal 208a, a defect 210b 6 layers deep may provide a scattering signal 208b, a defect 210c 20 layers deep may provide a scattering signal 208c, a defect 210d 34 layers deep may provide a scattering signal 208d, and a defect 210e 48 layers deep may provide a scattering signal 208e.

As illustrated in FIG. 2, the scattering signals 208a-e vary as a function of depth in ways that may be captured by measuring scattering signals at different solid angles as measured relative to the Z-direction (e.g., the first range of solid angles and the second range of solid angles of collected light 128 illustrated in FIG. 1C, or the like). For example, the scattering signal 208a associated with the surface-level defect 210a exhibits relatively high signal strength for low solid angles and gradually decreasing signal strength for higher solid angles. However, the scattering signal 208b associated with the defect 210b 6 layers deep exhibits a signal strength more evenly distributed as a function of solid angle. Further, as illustrated by the scattering signals 208c-208e, the scattering intensity generally decreases and becomes more concentrated at increasingly higher solid angles as the defect depth increases. An inspection tool 102 providing separate scattering signals for different ranges of solid angles (e.g., as illustrated in FIG. 1C, or the like) may differentiate between particles at different depths based on comparisons of the scattering intensity captured within the separate solid angle ranges.

Additionally, referring generally to scattering signals 208a-e, the signal strength is generally azimuthally symmetric relative to the Z-direction, but becomes increasingly directional along the X-axis (e.g., forward scattering and/or backscattering). Accordingly, an inspection tool 102 sensitive to azimuthal asymmetry may differentiate between particles at different depths based on comparisons of the scattering intensity at different azimuthal angles.

Further, although not illustrated in FIG. 2, it may be the case that the polarization of scattered light (e.g., collected light 128) may vary as a function of defect depth. Accordingly, measurements of scattering signals based on different combinations of polarizations of the incident beam (e.g., illumination beam 112) and collected signals (e.g., collected light 128) may be used to differentiate between particles at different depths. For example, it may be the case, but is not required to be the case, that defects 210 at or near the surface may scatter light that retains a polarization state of incident light (e.g., the illumination beam 112), whereas defects 210 further below the surface may exhibit increased power at polarization states different than the incident light.

It is to be understood that FIG. 2 and the associated description is provided solely for illustrative purposes and should not be interpreted as limiting. For example, the sample 114 may include any type of sample including, but not limited to, a solid sample having defects 210 embedded within the sample volume, a thick film having embedded defects 210, or a multilayer film stack having any number of film layers. By way of another example, the sample 114 may include one or more layers of any composition and are not limited to oxide or nitride layers as illustrated in FIG. 2. Further, the embedded defects 210 may be any type of embedded defects including, but not limited to, particles of the same or a different composition as surrounding material, cracks, or voids. The variations of scattering signals 208 as a function of the depth of defects 210 may vary accordingly. Further, the scattering signals 208a-e illustrated in FIG. 2 represent simulations associated with a particular measurement configuration and incorporate a non-limiting set of assumptions. In this regard, the defects 210 and the scattering signals 208a-e of FIG. 2 merely provide a non-limiting example of how scattering signals 208 may vary as a function of defect depth.

Figure 3:
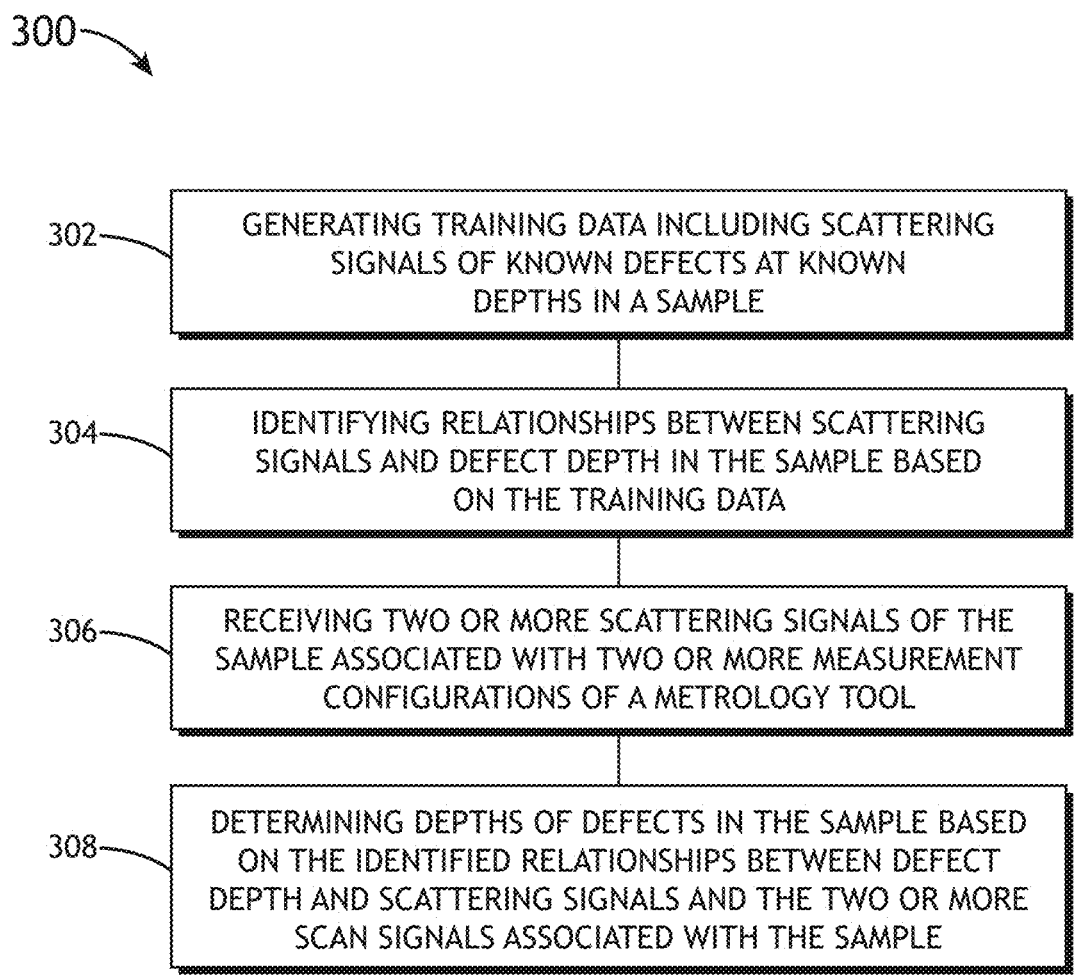
FIG. 3 is a flow diagram illustrating steps performed in a method for determining depths of defects in a sample, in accordance with one or more embodiments of the present disclosure.

FIG. 3 is a flow diagram illustrating steps performed in a method 300 for determining depths of defects in a sample, in accordance with one or more embodiments of the present disclosure. Applicant notes that the embodiments and enabling technologies described previously herein in the context of the inspection system 100 should be interpreted to extend to method 300. It is further noted, however, that the method 300 is not limited to the architecture of the inspection system 100.

In one embodiment, the method 300 includes a step 302 of generating training data including scattering signals of known defects at known depths in a training sample. For example, the training data may include scattering signals associated with representative defects (e.g., defects 210) at various depths in a sample (e.g., sample 114). Further, the sizes and compositions of the sample as well as the defects within the training data may be selected to match the expected conditions of inspection. For instance, the expected (e.g., designed) structure and composition of the samples are typically well known and tightly controlled in a production environment. It may be the case that the types, structures, and/or compositions of expected defects may also be well known such that the training data may include the corresponding scattering signals at various depths. However, it may also be the case that the types, structures, and/or compositions of the defects may not be well-understood for a given process. Accordingly, the training data may include scattering signals associated with a wide range of defects such that inspection may be used to classify defects as well as determine defect depth.

Training data may be generated by any technique known in the art. In one embodiment, training data is generated based on multiple measurements (e.g., scattering signals) of one or more training samples using different measurement configurations. For example, training samples representative of samples of interest to be inspected may be fabricated with selected defects at known depths. The training samples may then be inspected using an inspection tool (e.g., inspection tool 102 or the like) to generate multiple scattering signals associated with the defects using different measurement configurations. In another embodiment, training data is generated based on simulations of one or more training samples. For example, simulated versions of training samples representative of samples of interest to be inspected may be generated. Further, multiple scattering signals representative of those generated by an inspection tool to be used to inspect the samples of interest may be simulated. The simulations may be performed using any technique known in the art such as, but not limited to, rigorous coupled wave analysis (RCWA).

In another embodiment, the method 300 includes a step 304 of identifying relationships between scattering signals and defect depth in the sample based on the training data. Further, the step 304 may include identifying relationships between scattering signals and defect depth in the sample for multiple defect types, structures, and/or compositions present in the training data.

In another embodiment, the method 300 may include a step 306 of receiving two or more scattering signals of a sample (e.g., a sample of interest) associated with two or more measurement configurations of an inspection tool. For example, an inspection tool (e.g., inspection tool 102) may illuminate a test sample with an illumination beam and generate scattering signals based on light scattered and/or reflected from the test sample in response to the illumination beam. Further, the two or more scattering signals may correspond to measurement configurations used to generate the training data. In this regard, the training data may be representative of the test sample.

As described previously herein, the two or more scattering signals may be associated with different combinations of measurement parameters such as, but not limited to, a wavelength of the illumination beam, a polarization of the illumination beam, a polarization of collected light, and a solid angle at which light from the sample is collected. Further, the two or more scattering signals may be collected sequentially or simultaneously. For example, the inspection tool 102 illustrated in FIGS. 1C and 1D may simultaneously generate two scattering signals associated with different solid angle ranges. Additional scans with varying combinations of the wavelength of the illumination beam 112, the polarization of the illumination beam 112, or the polarization of collected light 128 in the collection channels may also be generated to provide any number of scattering signals.

In another embodiment, the method 300 may include a step 308 of determining depths of defects in the sample based on the identified relationships between defect depth and scattering signals (e.g., determined in step 304) and the two or more scattering signals associated with the sample (e.g., provided in step 306).

Relationships between scattering signals and defect depth in the sample based on the training data may be generated using any technique known in the art. In one embodiment, scattering signals generated with different measurement configurations may be compared to determine a series of rules or patterns that may be used to extract defect depth. In this regard, the step 304 may implement rule-based binning in which a series of analysis steps may be defined for sorting defects into depth ranges based on scattering signals with selected measurement configurations. For example, it may be the case that a comparison of a first set of scattering signals (associated with selected measurement configurations) may distinguish surface-level defects from sub-surface defects, a second set of scattering signals may distinguish defects within a first depth range (e.g., a first bin) from remaining depth ranges (e.g., bins), and so on. In this regard, defects within each depth range of interest may be distinguished based on a selected series of comparisons between different scattering signals.

Referring now to FIGS. 4-7, rule-based binning of defect depths into defect ranges based on the multilayer sample 114 illustrated in FIG. 2 is generally described in accordance with one or more embodiments of the present disclosure. FIGS. 4-7 are plots of training data including scattering signals associated with the sample 114 associated with multiple measurement conditions. Accordingly, the training data include measurements of defects located at five locations: defects 210a on a surface of the sample 114, defects 210b located 6 layers deep, defects 210c 20 layers deep, defects 210d 34 layers deep, and defects 210e 48 layers deep. These five locations (surface, 6 layers deep, 20 layers deep, 34 layers deep, and 48 layers deep) may thus represent five different depth bins into which defects of additional samples of interest having unknown defects may be sorted. It is to be understood that the number and distribution of depth bins is provided solely for illustrative purposes and should not be interpreted as limiting.

FIGS. 4-7 may be, but are not required to be, representative of scattering signals generated with an inspection tool (e.g., inspection tool 102) having three channels for generating scattering signals associated with light emanating from the sample 114 illustrated in FIG. 2 within three different ranges of solid angles. In this regard, the various scattering signals illustrated in FIGS. 4-7 may be representative of different combinations of the wavelength of the illumination beam 112, the polarization of the illumination beam 112, the polarization of collected light 128, and the solid angle of collected light 128.

Figure 4:
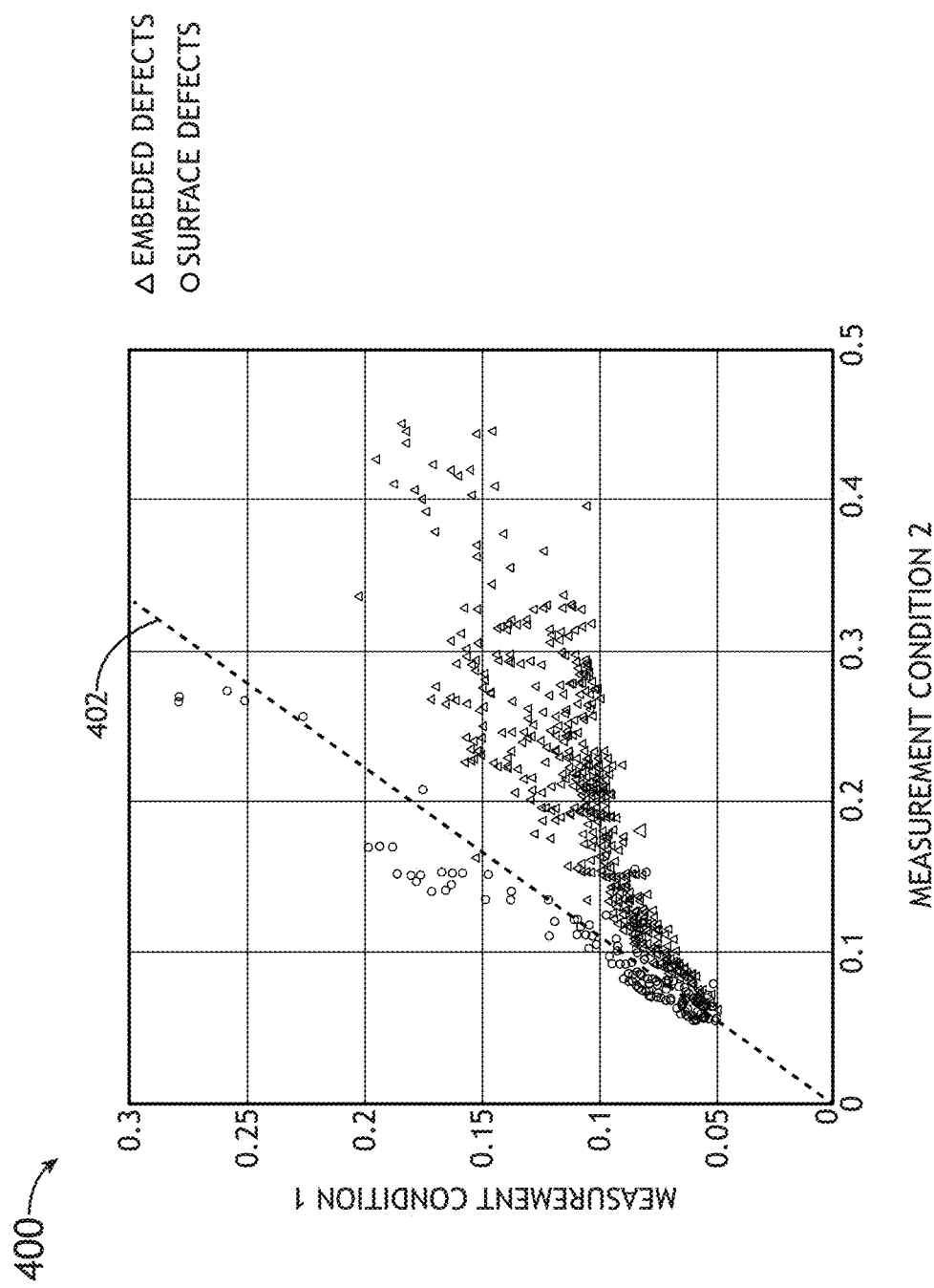
FIG. 4 is a plot of training data including scattering signals associated with the sample using first and second measurement conditions, respectively, in accordance with one or more embodiments of the present disclosure.

FIG. 4 is a plot 400 of training data including scattering signals associated with the sample 114 using first and second measurement conditions, respectively, in accordance with one or more embodiments of the present disclosure. The intensity values of defects measured with the first measurement condition are plotted along the Y-axis and the intensity values of defects measured using the second condition are plotted along the X-axis. As illustrated by plot 400, surface defects 210a are readily distinguishable from embedded defects 210b-e. For example, a dividing line 402 may be defined to distinguish the surface defects 210a from the embedded defects 210b-e. Accordingly, surface-level defects may be distinguished from embedded defects on samples of interest by generating scattering signals using the first and second measurement conditions and binning defects falling above the dividing line 402 as surface-defects. Additional rules, as defined below, may then be used to bin the embedded defects.

Figure 5:
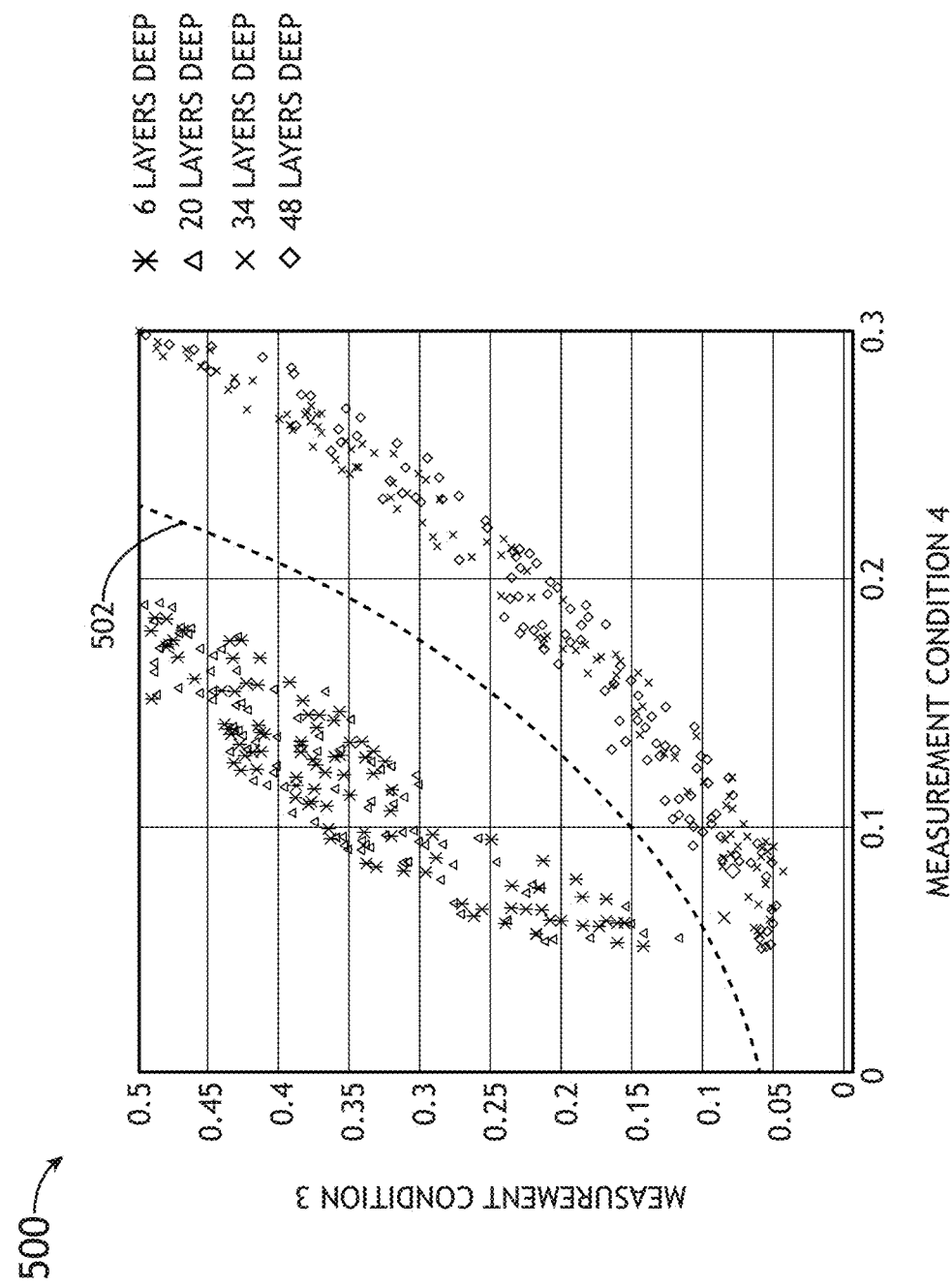
FIG. 5 is a plot of training data including scattering signals associated with the sample using the third and fourth measurement conditions, respectively, in accordance with one or more embodiments of the present disclosure.

FIG. 5 is a plot 500 of training data including scattering signals associated with the sample 114 using the third and fourth measurement conditions, respectively, in accordance with one or more embodiments of the present disclosure. The intensity values of defects measured with the third measurement condition are plotted along the Y-axis and the intensity values of defects measured using the fourth condition are plotted along the X-axis. As illustrated by plot 500, defects 210b 6 layers deep and defects 210c 20 layers deep are readily distinguishable from defects 210d 34 layers deep and defects 210e 48 layers deep. For example, a dividing line 502 may be defined to distinguish the defects 210b-210c embedded at either 6 or 20 layers deep from the defects 210d-210e embedded at either 34 or 48 layers deep. Accordingly, defects on samples of interest embedded at depths of approximately 6 or 20 layers deep may be distinguished from defects embedded at depths of approximately 34 or 48 layers deep by generating scattering signals using the third and fourth measurement conditions and binning defects based on the dividing line 502. Additional rules, as defined below, may then be used to further refine the defect depths.

Figure 6:
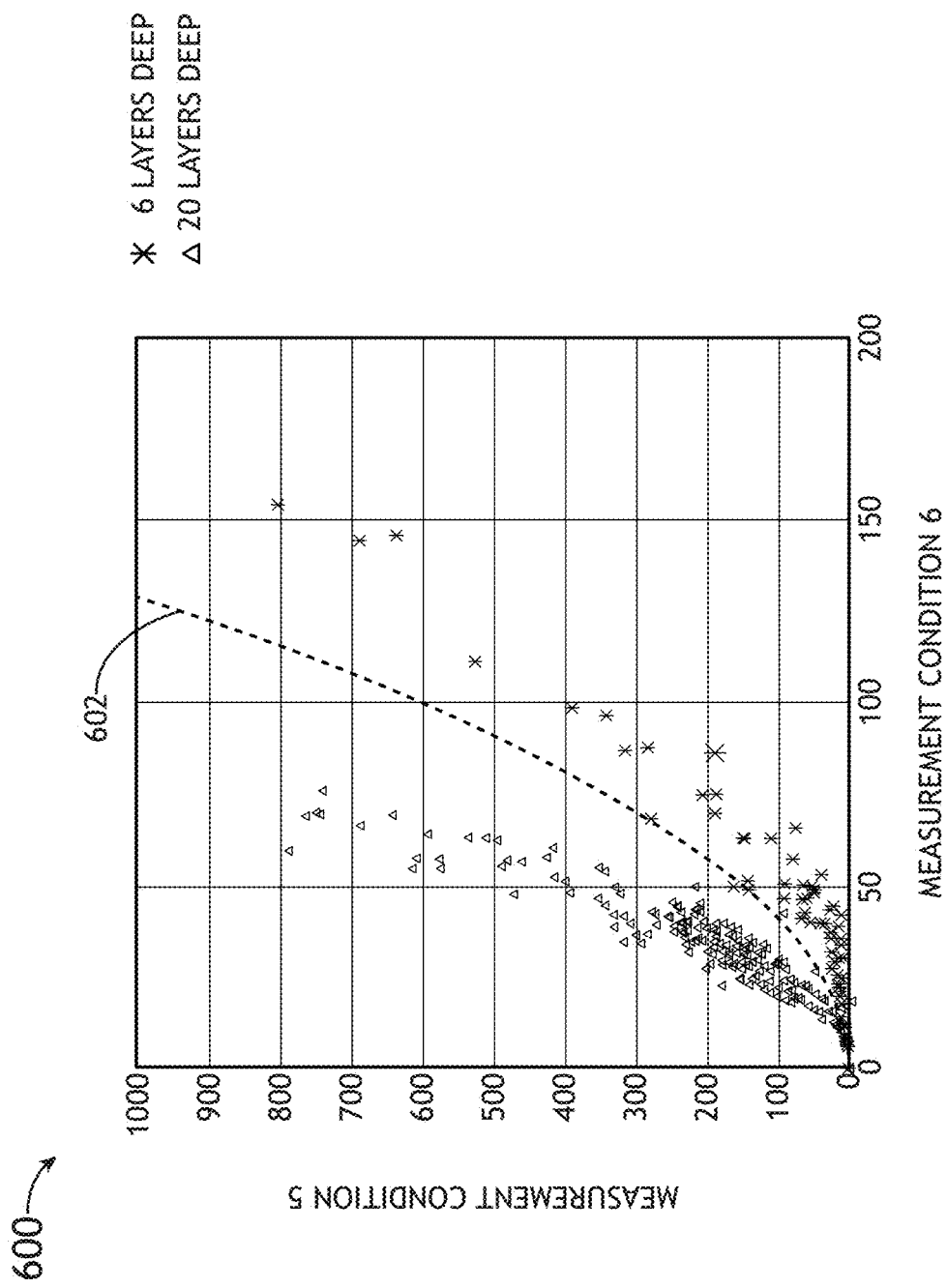
FIG. 6 is a plot of training data including scattering signals associated with the sample using the fifth and sixth measurement conditions, respectively, in accordance with one or more embodiments of the present disclosure.

FIG. 6 is a plot 600 of training data including scattering signals associated with the sample 114 using the fifth and sixth measurement conditions, respectively, in accordance with one or more embodiments of the present disclosure. The intensity values of defects measured with the fifth measurement condition are plotted along the Y-axis and the intensity values of defects measured using the sixth condition are plotted along the X-axis. As illustrated by plot 600, defects 210b 6 layers deep are readily distinguishable from defects 210c 20 layers deep. For example, a dividing line 602 may be defined to distinguish the defects 210b embedded at 6 layers deep from the defects 210c embedded at 20 layers deep. Accordingly, defects on samples of interest embedded at depths of approximately 6 layers deep may be distinguished from defects embedded at depths of approximately 20 layers deep by generating scattering signals using the fifth and sixth measurement conditions and binning defects based on the dividing line 602. Additional rules, as defined below, may then be used to further refine the defect depths for remaining defects.

Figure 7:
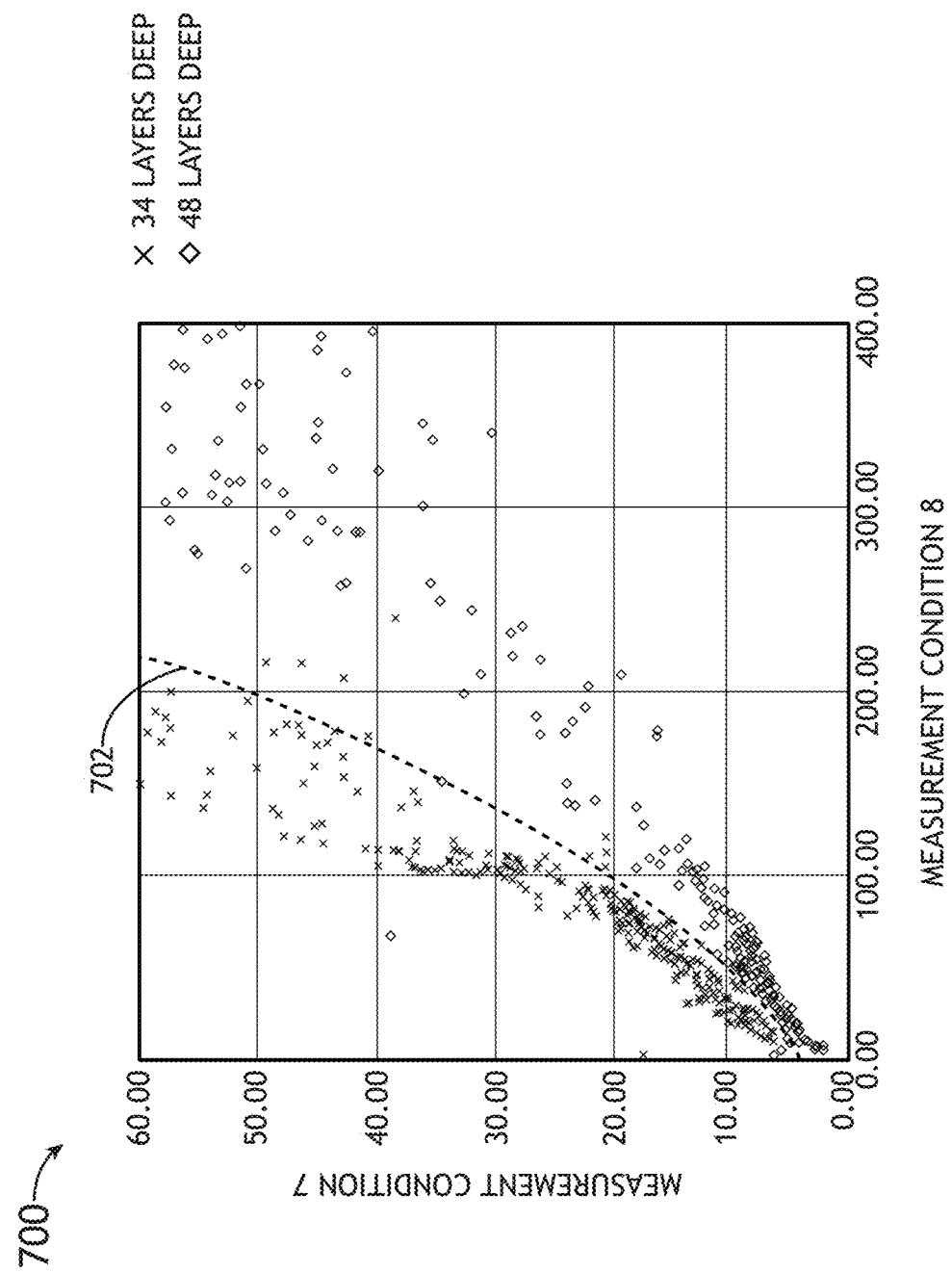
FIG. 7 is a plot of training data including scattering signals associated with the sample using seventh and eighth measurement conditions, respectively, in accordance with one or more embodiments of the present disclosure.

FIG. 7 is a plot 700 of training data including scattering signals associated with the sample 114 using seventh and eighth measurement conditions, respectively, in accordance with one or more embodiments of the present disclosure. The intensity values of defects measured with the seventh measurement condition are plotted along the Y-axis and the intensity values of defects measured using the eighth condition are plotted along the X-axis. As illustrated by plot 700, defects 210d 34 layers deep are readily distinguishable from defects 210e 48 layers deep. For example, a dividing line 702 may be defined to distinguish the defects 210d embedded at 34 layers deep from the defects 210e embedded at 48 layers deep. Accordingly, defects on samples of interest embedded at depths of approximately 34 layers deep may be distinguished from defects embedded at depths of approximately 48 layers deep by generating scattering signals using the seventh and eighth measurement conditions and binning defects based on the dividing line 702.

Depths of defects on samples of interest may thus be sorted into depth ranges (e.g., bins) by generating eight scattering signals and sequentially comparing the various scattering signals based on the rules above defined based on the training data. Further, these scattering signals may be generated sequentially or simultaneously. For example, the inspection tool 102 illustrated in FIGS. 1C and 1D is configured to simultaneously generate three scattering signals associated with different solid angle ranges and polarizations. Accordingly, the inspection tool 102 illustrated in FIGS. 1C and 1D may generate up to nine scattering signals in three inspection passes. Further, it is to be understood that FIGS. 4-7 and the associated description are provided solely for illustrative purposes and should not be interpreted as limiting. Rules for defect depth binning may be generated by comparing any combination of scattering signals. For example, although FIGS. 4-7 illustrate comparisons of eight different scattering signals (e.g., associated with unique measurement conditions 1-8), rules for defect depth binning may also be based on comparisons of any selected scattering signal with two or more additional scattering signals. In another embodiment, rules for defect depth binning may be generated using nine different scattering signals with different solid angle ranges and polarizations (e.g., generated by the inspection tool 102 illustrated in FIGS. 1C and 1D, or the like). Additionally, rules for defect depth binning may be generated using an inspection tool 102 configured to provide measurements using any combination of solid angle ranges or polarizations. Further, the rules derived for depth binning may vary depending on the specific characteristics of samples of interest (e.g., number and composition of layers) as well as the type and composition of defects.

In another embodiment, defect depth may be determined through a multidimensional pattern recognition technique. For example, a machine-learning algorithm may be trained to determine the relationships between defect depth and scattering signal based on the training data during a training phase.

Multidimensional pattern recognition may be performed using any analysis technique known in the art such as, but not limited to, classification, sorting, clustering, outlier detection, signal response metrology, regression analysis, instance-based analysis (e.g., nearest neighbor analysis, or the like), dimensionality reduction (e.g., factor analysis, feature extraction, principal component analysis, or the like), supervised learning (e.g., artificial neural networks, support-vector machines, random forests, or the like), semi-supervised learning (e.g., generative models, or the like), unsupervised learning (e.g., vector quantization, or the like), deep learning, or Bayesian statistics. It is to be understood that the analysis techniques and any associated labels are provided solely for illustrative purposes and are not intended as limiting.

Further, defect depths on samples of interest (e.g., test samples) may be provided in step 308 by the machine-learning algorithm during an inspection phase. For example, the scattering signals from the samples of interest may be provided to the machine-learning algorithm as inputs and the defect depths (either defect values or bins) may be provided as outputs based on the relationships between defect depth and scattering signals identified in step 302.

In another embodiment, the method 300 includes classifying defects based on the scattering signals. For example, the method 300 may include extracting one or more characteristics of embedded defects such as, but not limited to, defect composition, size, structure, or type (e.g., particle, crack, void, or the like). As described previously herein, the training data may include scattering signals associated with multiple defects (e.g., defects having different compositions, sizes, structures, or types). Accordingly, the defect characteristics may be determined using the same or substantially similar techniques as described herein regarding depth determination such as, but not limited to, rule-based classification or multidimensional pattern classification techniques.

In another embodiment, the scattering signals are generated with samples at a fixed focus height. In this regard, samples in the inspection tool (e.g., inspection tool 102) may be located at a fixed height with respect to illumination and/or collection optics (e.g., the objective lens 134 in FIGS. 1C and 1D, the illumination focusing element 122 and/or the collection focusing element 126 in FIG. 1B, or the like). It is recognized herein that providing scattering signals at a fixed focus height may facilitate accurate and efficient generation of the scan signals. For example, varying the focus height of a sample during a scan (e.g., using the sample stage 124 of the inspection tool 102) may require relatively longer acquisition times than scattering signals at a fixed focus height, which may negatively impact throughput. In particular, sample acquisition times of a two-dimensional sample scan (e.g., within the X-Y plane of FIG. 2) suitable for characterizing defects across a two-dimensional portion of a sample may be prohibitively long if scattering signals at multiple focal heights are required. Further, acquisition of scattering signals at multiple focus heights may introduce errors (e.g., registration errors of the sample stage 124) that may negatively impact the accuracy of the scattering signals.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An inspection system comprising:
   an illumination source configured to generate an illumination beam;
   one or more illumination optics to direct the illumination beam to a sample;
   a first collection channel including at least a first detector to collect light from the sample in response to the illumination beam within a first range of solid angles, the first collection channel further including a first polarizer to control a polarization of the light from the sample incident on the first detector;
   a second collection channel including at least a second detector to collect light from the sample in response to the illumination beam from the illumination source within a second range of solid angles different than the first range of solid angles, the second collection channel further including a second polarizer to control a polarization of the light from the sample incident on the second detector; and
   a controller including one or more processors configured to execute program instructions causing the one or more processors to:
      receive two or more scattering signals, the two or more scattering signals including one or more scattering signals from the first collection channel based on one or more orientations of the first polarizer, the two or more scattering signals further including one or more scattering signals from the second collection channel based on one or more orientations of the second polarizer; and
      determine depths of one or more defects in the sample based on comparing the two or more scattering signals to training data, the training data including scattering signals from a training sample having known defects at known depths.

2. The inspection system of claim 1, wherein determining depths of one or more defects in the sample based on comparing the two or more scattering signals to the training data comprises:
   sorting the one or more defects in the sample into depth bins based on comparing the two or more scattering signals to the training data.

3. The inspection system of claim 2, wherein the depth bins comprise:
   two or more depth bins.

4. The inspection system of claim 2, wherein the depth bins comprise:
   a surface depth bin and two or more sub-surface depth bins.

5. The inspection system of claim 2, wherein the depth bins comprise:
   a surface depth bin and four or more sub-surface depth bins.

6. The inspection system of claim 1, wherein determining depths of one or more defects in the sample based on comparing the two or more scattering signals to training data comprises:
   generating one or more rules for determining defect depth based on the training data; and
   applying the one or more rules to the two or more scattering signals to determine the depths of the one or more defects in the sample.

7. The inspection system of claim 1, wherein determining depths of one or more defects in the sample based on comparing the two or more scattering signals to training data comprises:

training a machine learning algorithm with the training data, wherein the machine learning algorithm includes at least one of a supervised learning, semi-supervised learning or deep learning technique;

providing the two or more scattering signals as inputs to the machine learning algorithm; and determining the depths of one or more defects in the sample based on an output of the machine learning algorithm.

8. The inspection system of claim 1, wherein the one or more defects comprise:

one or more particles embedded in the sample.

9. The inspection system of claim 1, wherein the sample comprises:

a semiconductor wafer.

10. The inspection system of claim 1, wherein the sample comprises:

a film deposited on a substrate.

11. The inspection system of claim 1, wherein the sample comprises:

a multilayer film stack deposited on a substrate.

12. The inspection system of claim 1, wherein the one or more illumination optics include an objective lens, wherein the first range of solid angles includes a first subset of solid angles within a numerical aperture of the objective lens, wherein the at least a second set of collection angles includes a second subset of solid angles within the numerical aperture of the objective lens.

13. The inspection system of claim 12, wherein the first and second collection channels are azimuthally symmetric.

14. The inspection system of claim 12, wherein the first range of solid angles comprises:

a cone of solid angles ranging from a direction normal to the sample to a first solid angle, wherein the second range of solid angles comprises:

an annular distribution of solid angles ranging from the first solid angle to a second solid angle larger than the first solid angle.

15. The inspection system of claim 14, wherein the one or more scattering signals from the second collection channel comprise:

two scattering signals based on two orthogonal orientations of the second polarizer.

16. The inspection system of claim 15, wherein the one or more scattering signals from the first collection channel comprise:

one scattering signal based on a single orientation of the first polarizer.

17. The inspection system of claim 14, wherein the one or more scattering signals from the first collection channel comprise:

two scattering signals based on two orthogonal orientations of the first polarizer.

18. The inspection system of claim 1, wherein the one or more illumination optics direct the illumination beam from the illumination source to the sample at an oblique incidence angle.

19. The inspection system of claim 18, wherein at least one of the two or more scattering signals comprises:

a dark-field scattering signal.

20. The inspection system of claim 1, wherein the one or more illumination optics direct the illumination beam from the illumination source to the sample at a normal incidence angle.

21. The inspection system of claim 20, wherein at least one of the two or more scattering signals comprises:

a bright-field scattering signal.

22. The inspection system of claim 1, wherein the illumination source is configured to generate illumination including at least one of visible wavelengths, ultraviolet wavelengths, deep ultraviolet wavelengths, vacuum ultraviolet wavelengths, or extreme ultraviolet wavelengths.

23. The inspection system of claim 1, wherein the illumination source is configured to generate illumination including two wavelength ranges, wherein at least one wavelength range includes visible wavelengths.

24. The inspection system of claim 1, wherein the one or more illumination optics direct the illumination beam to the sample at a fixed focus height.

25. An inspection system comprising:

a controller including one or more processors configured to execute program instructions causing the one or more processors to:

receive one or more scattering signals from a first collection channel, the first collection channel including a first detector to collect light from a sample within a first range of solid angles in response to an illumination beam, the first collection channel further including a first adjustable polarizer to control a polarization of the light from the sample incident on the first detector, wherein the one or more scattering signals from the first collection channel are based on one or more polarization states of the first adjustable polarizer;

receive one or more scattering signals from a second collection channel, the second collection channel including a second detector to collect light from the sample in response to the illumination beam within a second range of solid angles different than the first range of solid angles, the second collection channel further including a second adjustable polarizer to control a polarization of the light from the sample incident on the second detector, wherein the one or more scattering signals from the second collection channel are based on one or more polarization states of the second adjustable polarizer; and determine depths of one or more defects in the sample based on comparing the one or more scattering signals from the first and second collection channels to training data, the training data including two or more training scattering signals as a function of defect depth from at least one training sample having known defects at known depths, the two or more training scattering signals including at least one training signal from the first collection channel and at least one training signal from the second collection channel.

26. The inspection system of claim 25, wherein determining depths of one or more defects in the sample based on comparing the two or more scattering signals to the training data comprises:

sorting the one or more defects in the sample into depth bins based on comparing the two or more scattering signals to the training data.

27. The inspection system of claim 26, wherein the depth bins comprise:

two or more depth bins.

28. The inspection system of claim 26, wherein the depth bins comprise:

a surface depth bin and two or more sub-surface depth bins.

29. The inspection system of claim 26, wherein the depth bins comprise:
a surface depth bin and four or more sub-surface depth bins.

30. The inspection system of claim 25, wherein determining depths of one or more defects in the sample based on comparing the two or more scattering signals to training data comprises:
generating one or more rules for determining defect depth based on the training data; and
applying the one or more rules to the two or more scattering signals to determine the depths of the one or more defects in the sample.

31. The inspection system of claim 25, wherein determining depths of one or more defects in the sample based on comparing the two or more scattering signals to training data comprises:
training a machine learning algorithm with the training data, wherein the machine learning algorithm includes at least one of a supervised learning, semi-supervised learning or deep learning technique;
providing the two or more scattering signals as inputs to the machine learning algorithm; and
determining the depths of one or more defects in the sample based on an output of the machine learning algorithm.

32. The inspection system of claim 25, wherein the one or more defects comprise:
one or more particles embedded in the sample.

33. The inspection system of claim 25, wherein the one or more illumination optics include an objective lens, wherein the first range of solid angles includes a first subset of solid angles within a numerical aperture of the objective lens, wherein the at least a second set of collection angles includes a second subset of solid angles within the numerical aperture of the objective lens.

34. The inspection system of claim 33, wherein the first and second collection channels are azimuthally symmetric.

35. The inspection system of claim 34, wherein the one or more scattering signals from the second collection channel comprise:
two scattering signals based on two orthogonal orientations of the second polarizer, wherein the one or more scattering signals from the first collection channel comprise:
one scattering signal based on a single orientation of the first polarizer.

36. The inspection system of claim 25, wherein the one or more illumination optics direct the illumination beam from the illumination source to the sample at an oblique incidence angle.

37. The inspection system of claim 36, wherein at least one of the two or more scattering signals comprises:
a dark-field scattering signal.

38. The inspection system of claim 25, wherein the one or more illumination optics direct the illumination beam from the illumination source to the sample at a normal incidence angle.

39. The inspection system of claim 38, wherein at least one of the two or more scattering signals comprises:
a bright-field scattering signal.

40. An inspection method comprising:
receiving one or more scattering signals from a first collection channel, the first collection channel including a first detector to collect light from a sample within a first range of solid angles in response to an illumination beam, the first collection channel further including a first adjustable polarizer to control a polarization of the light from the sample incident on the first detector, wherein the one or more scattering signals from the first collection channel are based on one or more polarization states of the first adjustable polarizer;
receiving one or more scattering signals from a second collection channel, the second collection channel including a second detector to collect light from the sample in response to the illumination beam within a second range of solid angles different than the first range of solid angles, the second collection channel further including a second adjustable polarizer to control a polarization of the light from the sample incident on the second detector, wherein the one or more scattering signals from the second collection channel are based on one or more polarization states of the second adjustable polarizer; and
determining depths of one or more defects in the sample based on comparing the one or more scattering signals from the first and second collection channels to training data, the training data including two or more training scattering signals as a function of defect depth from at least one training sample having known defects at known depths, the two or more training scattering signals including at least one training signal from the first collection channel and at least one training signal from the second collection channel.

41. The inspection method of claim 40, wherein determining depths of one or more defects in the sample based on comparing the two or more scattering signals to the training data comprises:
generating one or more rules for determining defect depth based on the training data; and
applying the one or more rules to the two or more scattering signals to determine the depths of the one or more defects in the sample.

42. The inspection method of claim 40, wherein determining depths of one or more defects in the sample based on comparing the two or more scattering signals to training data comprises:
training a machine learning algorithm with the training data, wherein the machine learning algorithm includes at least one of a supervised learning, semi-supervised learning or deep learning technique;
providing the two or more scattering signals as inputs to the machine learning algorithm; and
determining the depths of one or more defects in the sample based on an output of the machine learning algorithm.

43. The inspection system of claim 1, wherein each of the two or more scattering signals corresponds to a different combination of measurement parameters, wherein the measurement parameters include at least two of a wavelength of the illumination beam, a polarization of the illumination beam, a selected collection channel, or a polarization of light detected in the selected collection channel, wherein the selected collection channel includes one of the first collection channel or the second collection channel.

44. The inspection system of claim 25, wherein each of the two or more scattering signals corresponds to a different combination of measurement parameters, wherein the measurement parameters include at least two of a wavelength of the illumination beam, a polarization of the illumination beam, a selected collection channel, or a polarization of light detected in the selected collection channel, wherein the selected collection channel includes one of the first collection channel or the second collection channel.

\* \* \* \* \*